United States Patent [19]
Ihara et al.

[11] Patent Number: 5,323,375
[45] Date of Patent: Jun. 21, 1994

[54] INFORMATION STORAGE APPARATUS

[75] Inventors: Sigeo Ihara, Hachioji; Tsuyoshi Uda, Kodaira; Ryo Imura, Tokorozawa, all of Japan

[73] Assignee: Hitachi, Ltd., Tokyo, Japan

[21] Appl. No.: 848,689

[22] Filed: Mar. 9, 1992

[30] Foreign Application Priority Data

Mar. 8, 1991 [JP] Japan .................. 3-043205

[51] Int. Cl.$^5$ .............................................. G11B 9/08
[52] U.S. Cl. ........................................ 369/126; 365/151
[58] Field of Search ............ 369/100, 101, 126, 275.2, 369/275.3, 275.4; 250/492.3, 492.2 R; 365/114, 118, 151

[56] References Cited

U.S. PATENT DOCUMENTS

| | | | |
|---|---|---|---|
| 4,575,822 | 3/1986 | Quate | 365/174 |
| 4,826,732 | 5/1989 | Kazan et al. | 369/126 |
| 5,015,850 | 5/1991 | Zdeblick et al. | 369/101 |
| 5,038,322 | 8/1991 | Van Loenen | 369/101 |
| 5,043,578 | 8/1991 | Güethner et al. | 369/101 |
| 5,144,148 | 9/1992 | Eigler | 250/492.3 |
| 5,144,581 | 9/1992 | Toda et al. | 250/306 |

OTHER PUBLICATIONS

Hamers et al. "Scanning tunneling microscopy of Si(001)" vol. 34, No. 8, pp. 5343–5357, 1986.

Eigler et al. "Positioning single atoms with a scanning tunnelling microscope" vol. 344, pp. 524–526, Apr., 1990.

*Primary Examiner*—Paul M. Dzierzynski
*Assistant Examiner*—Kiet T. Nguyen
*Attorney, Agent, or Firm*—Antonelli, Terry, Stout & Kraus

[57] ABSTRACT

An information storage apparatus in which one unit (or one bit) of information is stored by bringing a fine tip electrode with a tip portion of a dimension on the order of an inter-atomic distance (or several angstroms) in proximity to an atom on a flat surface of a material (for example, a semiconductor) with a gap on the order of an inter-atomic distance being provided between the tip electrode and the atom, and applying a voltage to the tip electrode so that the alignment of a dimer (or a pair of atoms) on the material surface in the vicinity of the tip electrode is changed by virtue of a tunnelling effect which is a quantum mechanical effect.

40 Claims, 12 Drawing Sheets

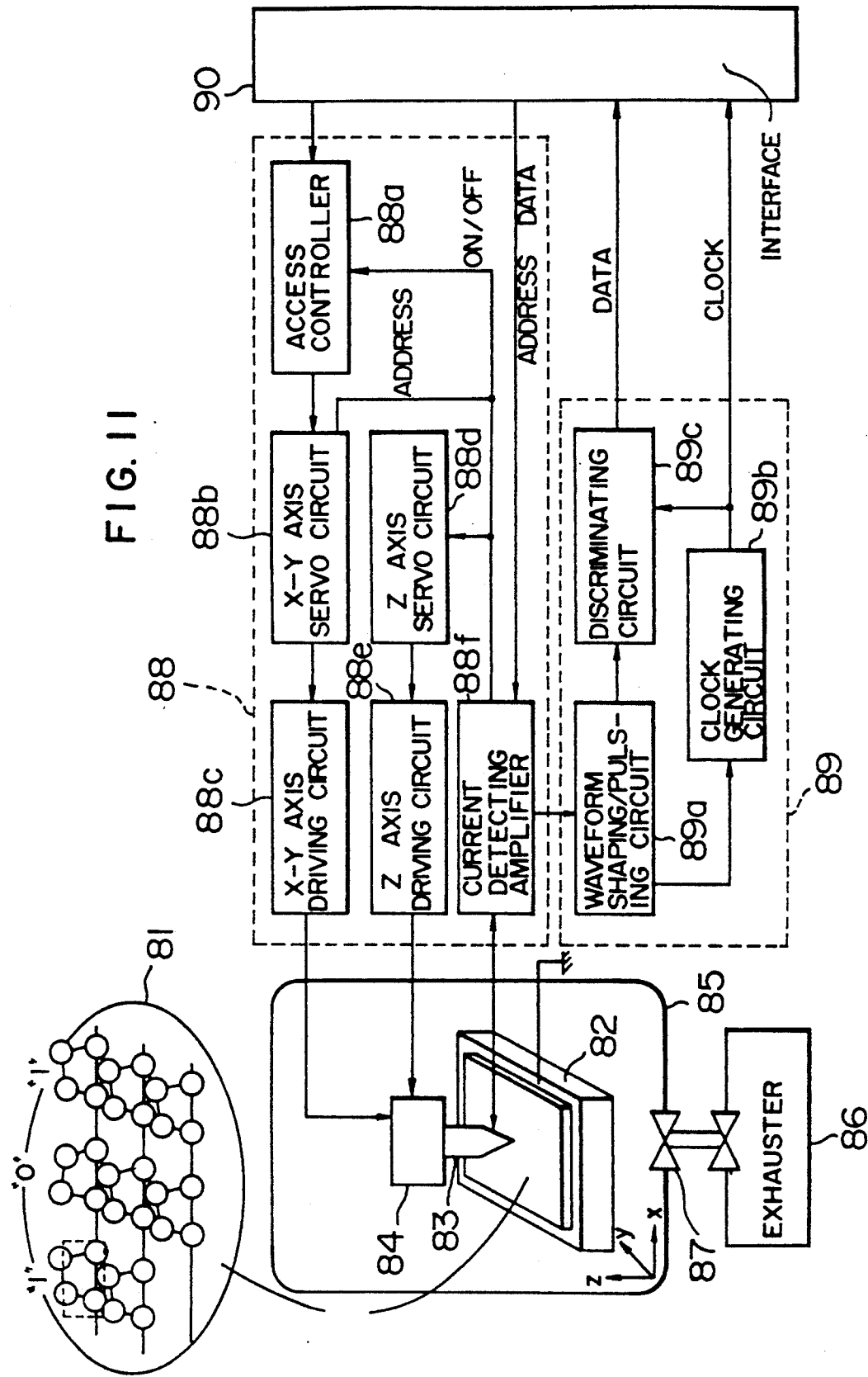
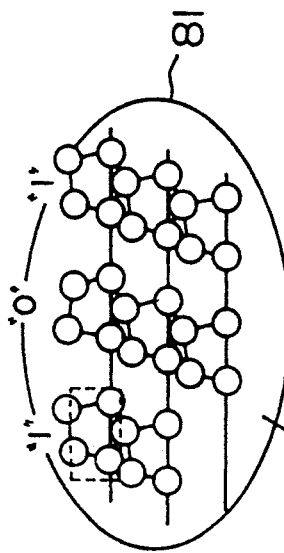
FIG. 11
FIG. 11A

INFORMATION STORAGE APPARATUS

BACKGROUND OF THE INVENTION

The present invention relates to a storage apparatus in which the writing and reading of information are possible, and more particularly to a storage apparatus in which a change in alignment of several atoms is used as the unit of stored information.

Conventional storage devices include a DRAM (Dynamic Random Access Memory) in which information is stored in accordance with whether or not electric charges are stored in a capacitor and an SRAM (Static Random Access Memory) in which information is stored by a flip-flop circuit. In order to store one bit of information, the SRAM and DRAM require areas of about 100 $nm^2$ and 25 $nm^2$, respectively. Techniques of writing characters on molecules with a very large molecular weight, e.g., adbenzene or a bulk surface are known for the realization of storage devices in which storage or recording with higher density is possible. In the conventional storage device such as SRAM or DRAM, the realization of a further high storage density is difficult due to the limitations of manufacturing techniques or the like.

In order to overcome such limitations, a technique may be considered in which an atom(s), which is the constituent unit or element of a substance, is used a a unit cell for storage of information.

SUMMARY OF THE INVENTION

An object of the present invention is to provide an information storage apparatus in which an area occupied by one storage unit or a unit cell is on the order of an inter-atomic distance.

To achieve the above object, in an information storage apparatus according to the present invention, a fine tip electrode including a tip portion having a dimension on the order of an inter-atomic distance (or several angstroms) is brought in proximity to an atom existing at a flat surface of a material (for example, a semiconductor) with a gap on the order of an inter-atomic distance being provided between the electrode and the atom, and an electric voltage is applied to the tip electrode so that the alignment of a dimer (or a pair of atoms) on the material surface in the vicinity of the electrode is displaced or changed by use of a quantum mechanical effect or a tunnelling effect, thereby storing one unit (or one bit) of information. In the present invention, the voltage applied corresponds to an energy having a value larger than that of an energy barrier having a magnitude of several electron volts for changing the alignment of a dimer on the material surface. Also, the value of the energy barrier is larger than an energy corresponding to room temperature (300° K.). Therefore, even if the storage apparatus is used at temperatures in the vicinity of room temperature, the alignment of a dimer on the surface exists stably.

Further, one unit (or one bit) of information is read in such a manner that a tunnelling current, produced when the tip electrode is brought in proximity to the dimer on the surface, is detected to judge the value of the tunnelling current which corresponds to the dimer alignment or atomic alignment. Namely, by use of the characteristic of the atomic alignment forming a reconstructed surface (or reconstruction) formed at the surface of a material (for example, a semiconductor) which is at a lower temperature than room temperature and can be regarded as being atomically flat, one unit of information or one bit is stored in an atomic alignment structure having a dimension of several angstroms. Information is fetched by reading the atomic alignment structure, more particularly, by use of an STM (Scanning Tunnelling Microscope). Further, information is written by a method in which the surface structure is changed or indented by use of the tip of a tip electrode of the STM, a method in which an atom to be absorbed is placed on the STM tip and the atom is moved by use of an electric force or a quantum mechanical force so that it is located at a desired position, or a method in which an MBE (Molecular Beam Epitaxy) apparatus is combined to write the information to the alignment structure of atoms.

In the information storage apparatus according to the present invention, a change in atomic alignment is taken as the recording or storage unit of information. Therefore, one unit of information can be stored in an area which is on the order of an inter-atomic distance. Also, an atomic alignment used is such that an energy barrier larger than an energy corresponding to room temperature is required for changing the atomic alignment. Therefore, information can be held stably even at room temperature.

BRIEF DESCRIPTION OF THE DRAWINGS

FIG. 1A is an enlarged view of a portion of FIG. 1;

FIG. 11 is a block diagram showing an embodiment of the whole of an information storage apparatus;

FIG. 11A is an enlarged view of a portion of FIG. 11;

FIG. 14A is an enlarged view of a portion of FIG. 14; and

DESCRIPTION OF THE PREFERRED EMBODIMENTS

R. J. Hamers et al. have reported an example in which a method of providing a uniform and flat surface at an atomic level is applied to fabrication of a semiconductor device (Physical Review B, Vol. 34, No. 8, pp. 5343–5357 (1986)). A stylus (electrode) or projection of semiconductor or metal with its tip having only one atom can also be fabricated by the reported method. Further, control techniques for positioning individual atoms and rearranging them are described by D. M. Eigler et al., Nature, Vol. 344, pp. 524–526 (1990). An information storage apparatus according to embodiments of the present invention will be described below, wherein information can be stored on a surface of crystalline material by use of the above techniques.

Figure 1:
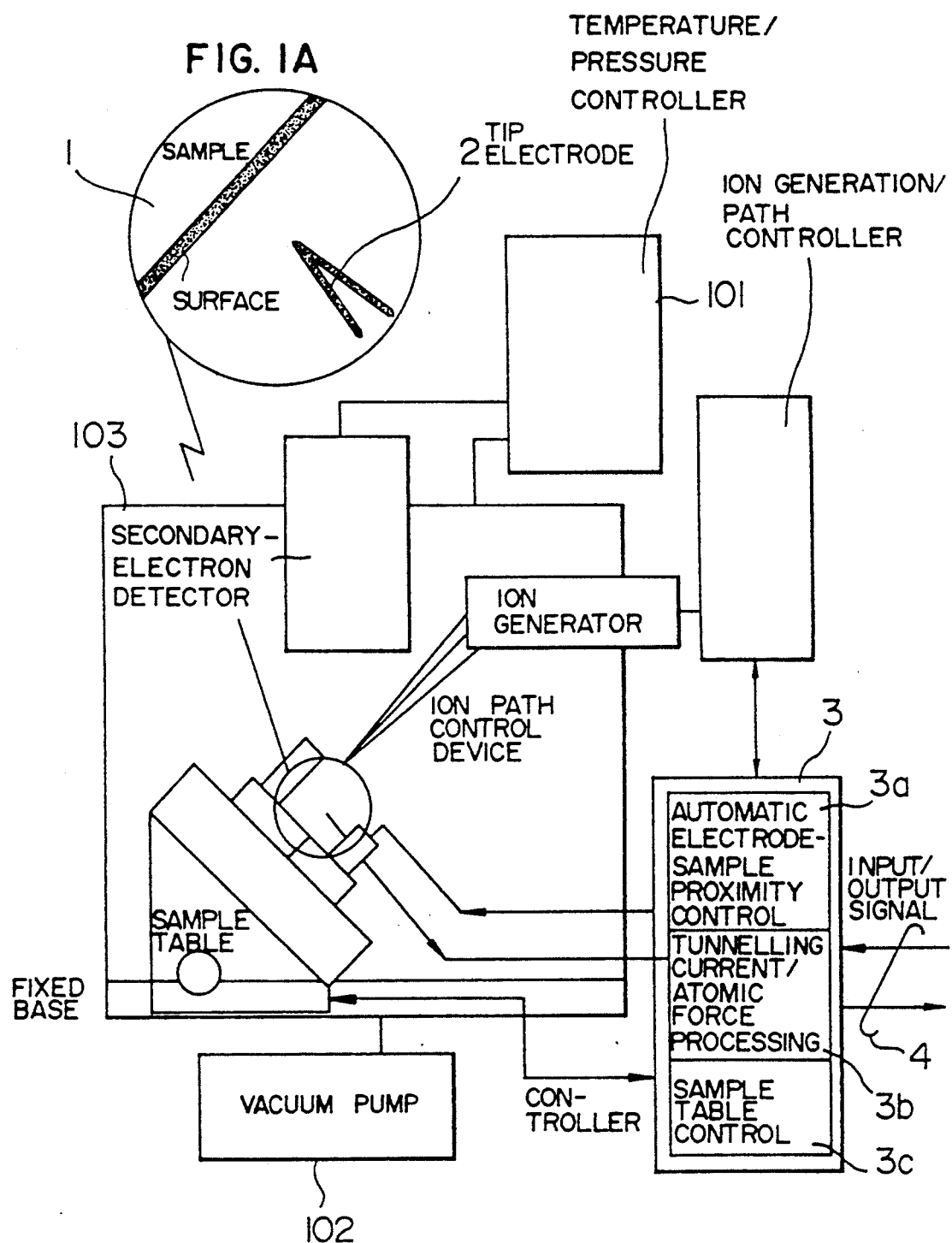
FIG. 1 is a block diagram showing an information storage apparatus according to an embodiment of the present invention.

FIG. 1 is a block diagram showing the whole information storage apparatus according to the present invention. Referring to FIG. 1, a temperature/pressure controller 101 and a vacuum pump 102 for controlling the temperature, the pressure and the degree of vacuum of the interior of a chamber 103 to maintain a clean surface of a sample 1 fixed on a sample table. A controller 3 supplied with an external signal 4 writes external information on the material surface of the sample 1 by controlling the position of a probe or tip electrode 2 above the sample surface as shown in detail in FIG. 1A and thereby controlling the positions of atoms at the sample surface. More specifically, an atom on the sample surface is displaced by the tip electrode 2, an electric or magnetic force is exerted on an atom to depress it under the surface, a depressed atom is pulled up by the tip electrode 2, or an atom is moved by the tip portion of the tip electrode 2 by virtue of an electric force or a quantum mechanical force to place the atom at any position or to remove the atom.

Figure 2:
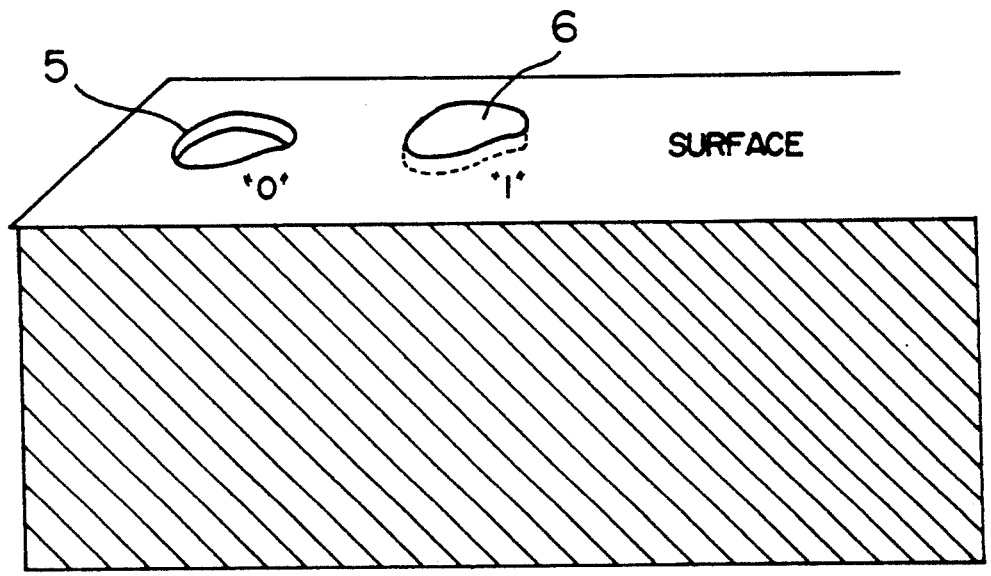
FIG. 2 is a schematic view showing a corresponding relationship between atomic alignments at a surface and bits.

Recorded or stored information is read using an apparatus such as an STM (Scanning Tunnelling Microscope) which can measure states of electrons and atoms on the surface of sample 1 by use of a tunnelling current or an atomic force induced by electrons. In this case, an operation for the writing or reading of information by the STM is performed after a part or all of atoms on the sample surface have been removed through heating by a laser and atoms have been piled on the sample surface by an MBE (Molecular Beam Epitaxy) apparatus. By the above method, an atomic pattern, existing in a surface structure, as shown by reference numeral 5 or 6 in FIG. 2, is caused to correspond to one bit which is one unit of information to be recorded. For example, a pattern of atoms depressed into the surface structure corresponds to "0" and a pattern of atoms protruding from the surface structure corresponds to "1".

In the following, explanation will be made taking an Si (100) plane as an example. It is known that the Si (100) plane includes some defects. Depending upon surface preparation conditions, there may be the case where the surface defects have a random distribution, the case where surface defects are localized, and the case where a pattern of surface defects having a certain ordered state is formed. In any case, if the surface state before a write operation is performed is recorded beforehand, it is possible to make the distinction of whether defects produced by newly writing information are those which were originally included.

Figure 3:
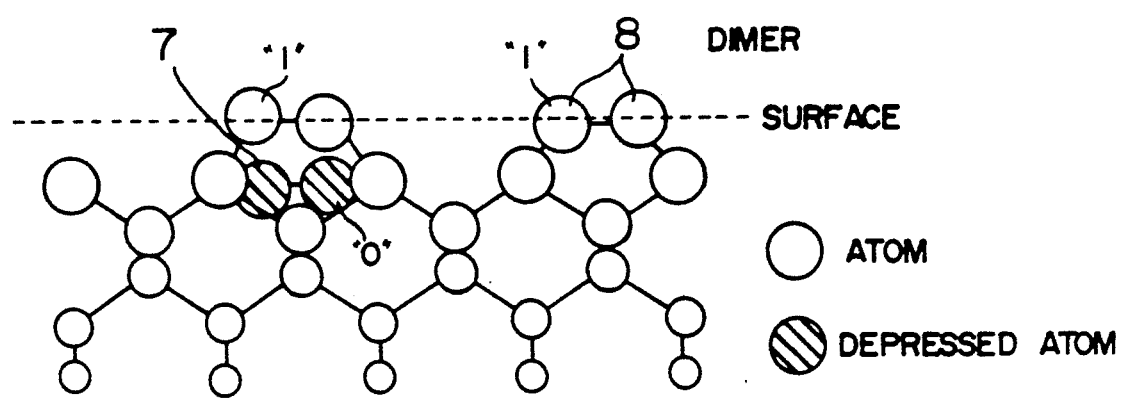
FIG. 3 is a side view showing a corresponding relationship between a dimer depressed into a surface, a surface dimer and bits.

In general, a semiconductor or the like has a characteristic surface reconstruction (or realignment structure) separately from the above-mentioned defects. One example of such a surface state is shown in FIG. 3. As shown in the figure, external information is stored in the atomic alignment structure of a crystalline surface in such a manner that the case where a dimer 8 (or a pair of atoms) exists on the surface, and the case where no dimer exists on the surface or the case where a dimer 7 is buried beneath (or depressed into) the surface, correspond to recording bits "1" and "0", respectively.

Figure 4:
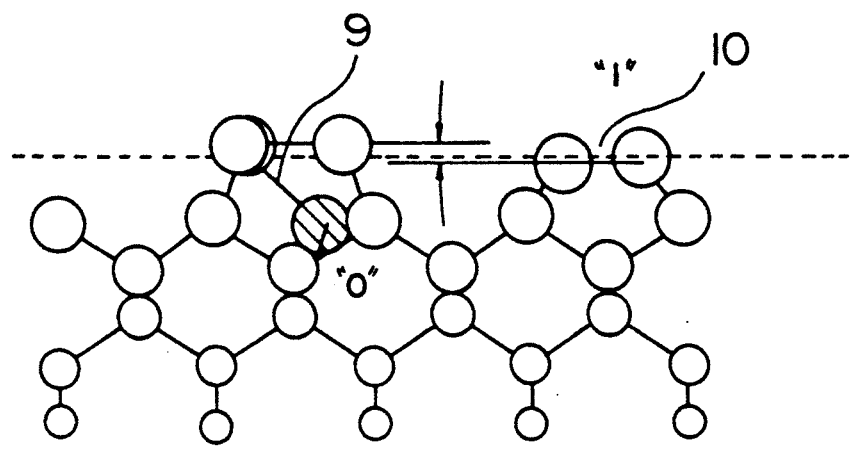
FIG. 4 is a side view showing a corresponding relationship between a dimer having an atom depressed into a surface, a surface dimer and bits.

FIG. 4 shows a corresponding relationship with information bits in the case where one of paired atoms forming a dimer is depressed into the surface. In FIG. 4, a dimer 9 including one atom depressed into the surface and a dimer 10 including both atoms on the surface correspond to recording bits "0" and "1", respectively. In the case of FIG. 4, too, external information can be stored in a similar manner to that shown in FIG. 3.

An energy of several electron volts is required to form the structure shown in FIG. 3 or 4. The formed structure stably exists at a temperature lower than a melting point of the material used, or more especially, in the vicinity of ordinary or room temperature or at temperatures lower than that. If the shown structure is utilized, excellent practicability can be obtained since a necessary energy is less as compared with a method in which a new atom is placed (or added) on a surface or an atom is removed from the surface and since an additional device for placing and removing the atom is not needed. Further, since the condition of existence of atoms does not change, the structure is excellent in that the same location can be used many times and overwrite is possible. Accordingly, the structure shown in FIG. 3 or 4 can be used as a programmable memory or a RAM. The structure can be used as an SRAM in the case where an information read operation does not produce an influence on the surface and as a DRAM in the case where the information read operation produces the influence. When an STM is used for providing an SRAM in which the surface is not affected upon reading of information, an operation for the writing or reading of information is performed with the tip of an STM electrode being separated from the surface by a distance of at least 10 Å and under conditions described by R. J. Hamers et al., Physical Review B, Vol. 34, No. 8, pp. 5343–5357 (1986).

Figure 5:
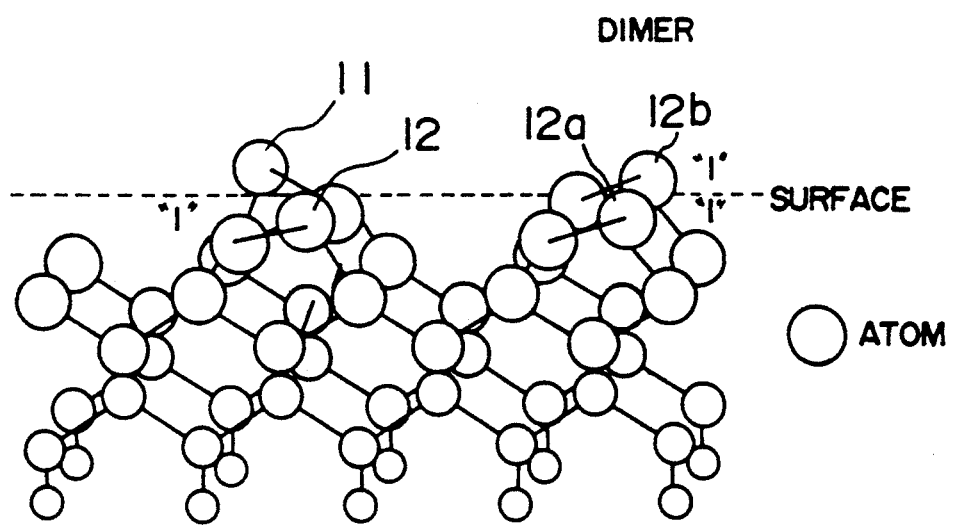
FIG. 5 is a side view showing a corresponding relationship between asymmetrical dimers and bits.

In general, a dimer in the vicinity of a surface exists in a state which is asymmetrical with respect to the surface, as shown in FIG. 5. Namely, in the vicinity of the surface exists a dimer 11 in which a bond between paired atoms forming the dimer has a direction ascending to the left (in FIG. 5) and a dimer 12 in which the bond has a direction ascending to the right (in FIG. 5). FIG. 5 illustrates a corresponding relationship between two asymmetrical dimers and recording information bits. More particularly, the dimer 11 having a bond with a reverse direction to neighbouring dimers 12a and 12b corresponds to a bit "0" and the dimer 12 having a bond with the same direction as the neighbouring dimers corresponds to a bit "1". Even in the case where asymmetrical dimers form a specified pattern or a disordered pattern as a whole, a difference caused by a write operation is distinguishable if an original surface pattern is recorded beforehand.

Since the direction of a dimer may change at temperatures on the order of 50° K., the direction of a dimer is unstable at room temperature. Therefore, it is necessary to maintain the whole of a sample at a low temperature. However, the structure shown in FIG. 5 can be used as an SRAM in the case where a read operation does not produce an influence on the surface and as a DRAM in the case where the read operation produces the influence. When an STM is used for providing an SRAM in which the surface is not affected upon reading of information, an operation for the writing or reading of information is performed with the tip of an STM electrode being separated from the surface by a distance of at least 10 Å and by use of the method and conditions described by R. J. Hamers et al.

Information write and read operations in the present invention will now be explained concretely with reference to FIG. 6 in conjunction with an example in which a material including dimers 11 and 12 existing at a clean Si (100) plane is used as a recording medium, as shown in FIG. 5. In the asymmetrical dimer 11 or 12, electrons move from an lower atom toward an upper atom. Therefore, the asymmetrical dimer 11 or 12 is in an energy state lowered by about several electron volts per one dimer as compared with a symmetrical dimer 8 in which two Si atoms forming the dimer are positioned at the same height. Accordingly, the dimer 11 or 12 is in an energy state which is stable as compared with the dimer 8. In order to cause a state transition between the dimers 11 and 12, it is necessary to pass through the state of the dimer 8 and hence it is required that an energy beyond an energy barrier having a magnitude of several electron volts must be applied to the dimer 11 or 12. Since the value of this energy barrier is larger than that of room temperature expressed in terms of energy, the state of the dimer 11 or 2 exists stably even at room temperature.

In the present embodiment, the writing of information is performed through transiting the asymmetrical leftward descending (or rightward ascending) dimer 12 to the asymmetrical rightward descending (or leftward ascending) dimer 11. The transition of the dimer state requires a passage through the state of the symmetrical dimer 8. Namely, an energy exceeding the energy barrier of several electron volts is required for one dimer. Provided that the leftward descent and the rightward descent are defined as bits "1" and "0", respectively, it is possible to write bit information (or binary code information) into atoms on a surface of the sample 1 by changing or switching the gradient of the asymmetrical dimer beyond the energy barrier.

The write and read of information are realized, for example, in the following manner. An upper atom of the asymmetrical dimer 12 has surplus electrons. Thus, as shown on the left-hand side of FIG. 6, a negative voltage necessary for making a passage beyond the energy barrier is applied to an STM tip electrode 2 from a power source 30 to move the surplus electrons from the upper dimer atom to a lower dimer atom. As the result of this movement or transfer of the electrons, the gradient of the asymmetrical dimer 12 becomes a rightward descent, as shown on the right-hand side of FIG. 6, thereby effecting the writing of one bit of information.

Figure 6:
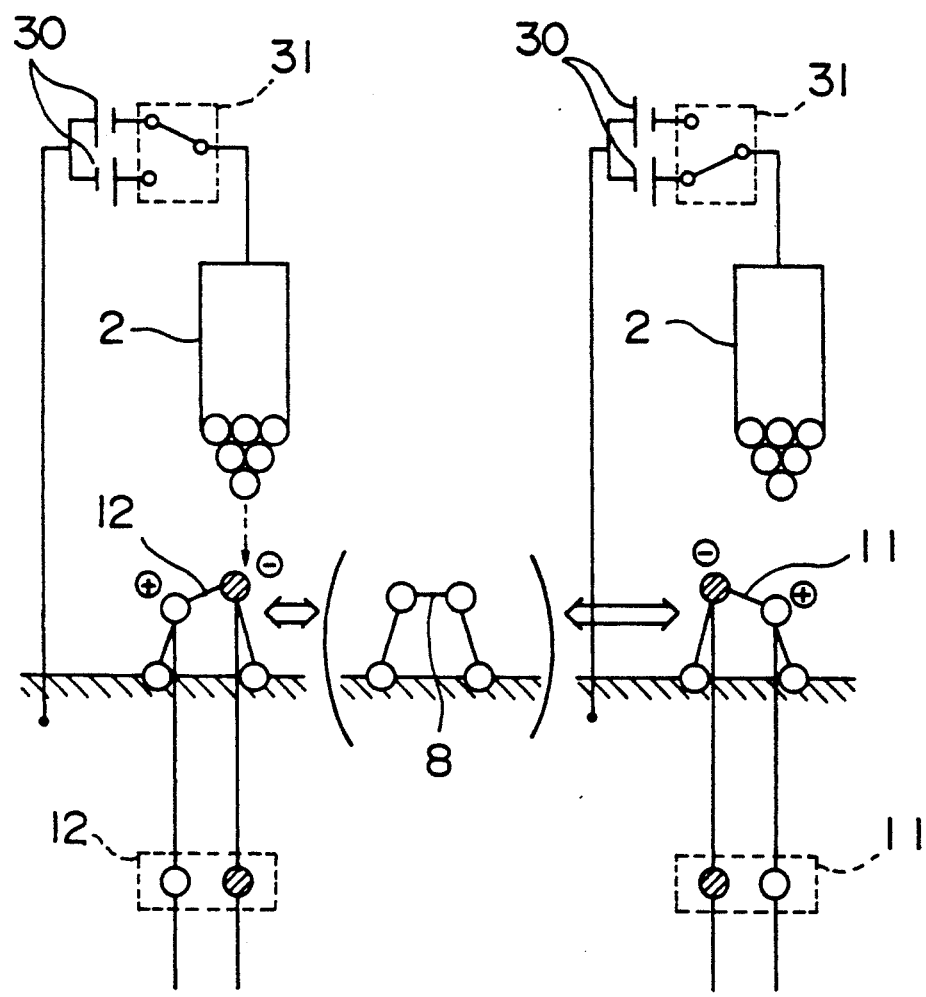
FIG. 6 is a diagram for explaining operations for writing and reading information.

When the written bit information is to be read, the power source 30 is switched to a positive voltage by a switch 31, as shown on the right-hand side of FIG. 6, so that a voltage having a magnitude to make no change of the gradient of the asymmetrical rightward descending dimer 11 is applied to the STM tip electrode 2 to acquire an STM image. The resolution of the STM in a height direction is on the order of 0.1 Å. Therefore, a difference in the atomic height of the asymmetrical dimer (several angstroms) is satisfactorily detectable. Accordingly, the reading of bit information is possible. By subjecting a plurality of dimers on the surface of the sample 1 to the above-mentioned operation while shifting or moving the position of the tip electrode 2, a rewritable or overwritable non-volatile file memory can be realized which has a storage density on the order of an inter-atomric distance.

Figure 7:
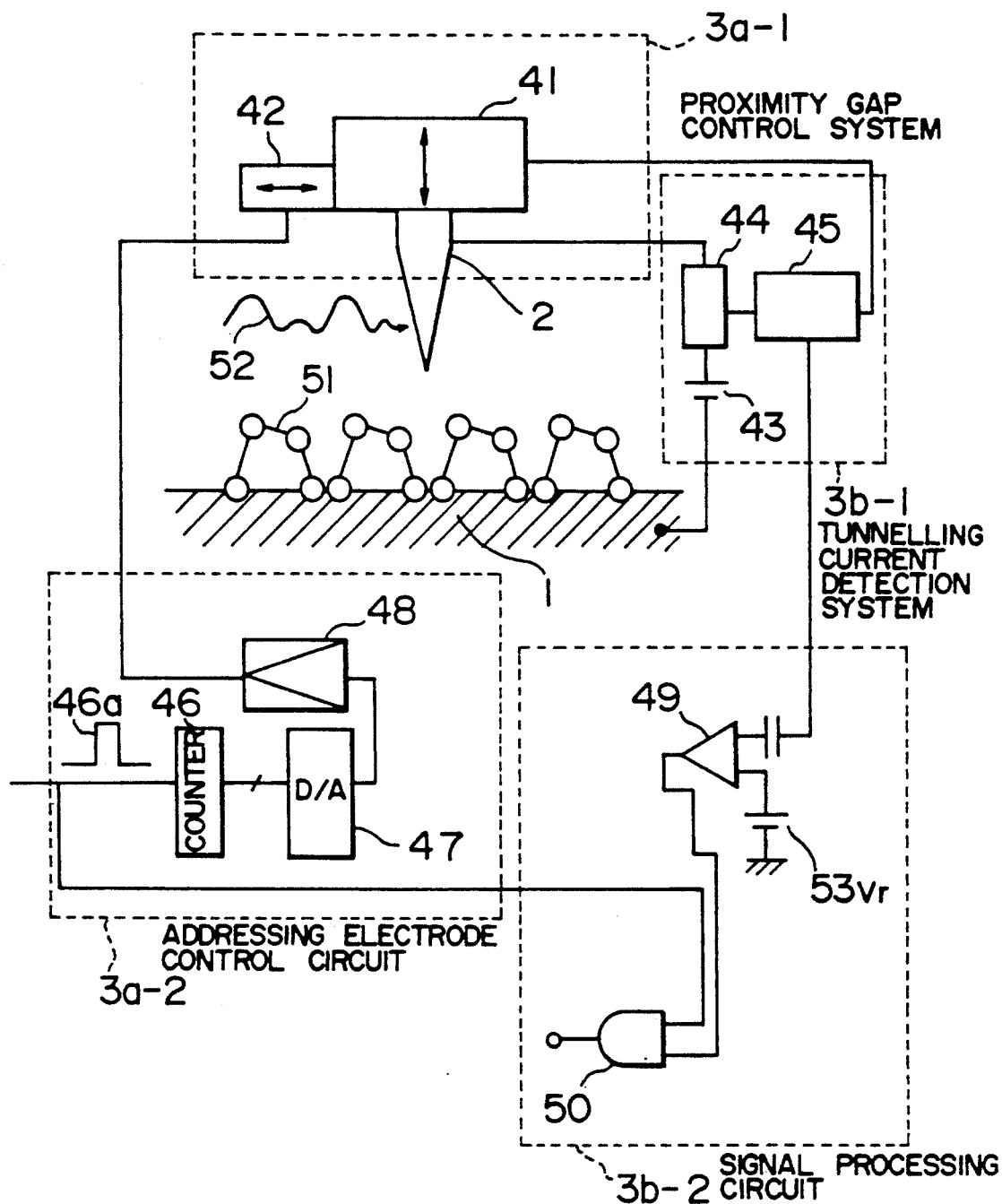
FIG. 7 is a diagram for explaining information write and read modes.

A further detailed embodiment of the recording/reproduction or writing/reading of information will be explained with reference to FIG. 7. The embodiment shown in FIG. 7 is based on a constant-current mode of an STM. An information storage apparatus shown in FIG. 7 includes a proximity gap control system 3a-1, an addressing electrode control circuit 3a-2, a tunnelling current detection system 3b-1, a signal processing circuit 3b-2, a tip electrode 2 and an Si substrate 1 which is a recording medium. Components enclosed by broken lines in FIG. 7 are included in the controller 3 shown in FIG. 1 and the corresponding components are designated by similar reference numerals or symbols in FIGS. 1 and 7.

The control system 3a-1 is composed of a tunnel gap controlling system 41 and an electrode scanning system 42. The detection system 3b-1 is composed of a D.C. bias 43 for reading a tunnelling current detection circuit 44 for extracting a tunnelling current from the tip electrode 2 and a constant-current controlling circuit 45 for producing a signal for correction of the position of the tip electrode 2 in an upward/downward direction from an output of the detection circuit 44 which corresponds to the tunnelling current. The control circuit 3a-2 for address designation and the processing circuit 3i b-2 for reading recorded information are digital circuits. The control circuit 3a-2 is composed of a counter 46, a D/A (digital-to-analog) converter 47 and a tip electrode scanning system driver circuit 48. The processing circuit 3b-2 is composed of a comparator 49 for shaping an analog signal into a digital signal and a gate circuit 50.

An information read operation is performed in accordance with the following procedure. First, the tip electrode 2 is set to a desired address. Thereafter, clock pulses 46a are inputted to the counter 47. As an output of the D/A converter 47 increases gradually from zero, the tip electrode 2 is scanned across the surface of the Si substrate 1. Thereby, a tunnelling current, which flows by virtue of the D.C. bias 43, changes in accordance with a change in tunnel gap caused by the unevenness in height of atoms 51 at the Si surface (or the atomic unevenness of the Si surface). When the constant-current controlling circuit 45 controls the controlling system 41 so that the tunnelling current is kept constant, the position of the tip electrode 2 in an upward/downward direction is controlled corresponding to the alignment of atoms 51 at the Si surface, as shown by a locus 52. Namely, height information is outputted from the controlling circuit 45 in accordance with the unevenness of atoms 51 at the Si surface.

Figure 8:
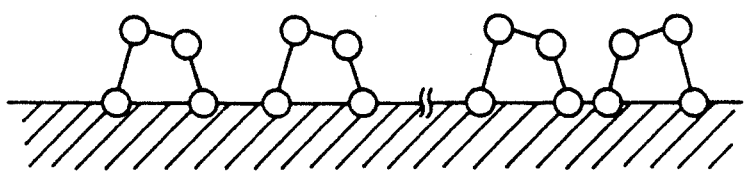
FIGS. 8(*a*1), 8(*a*2), 8(*b*1), 8(*b*2), and 8(*c*) are charts for explaining signal processing for information.
Figure 8:
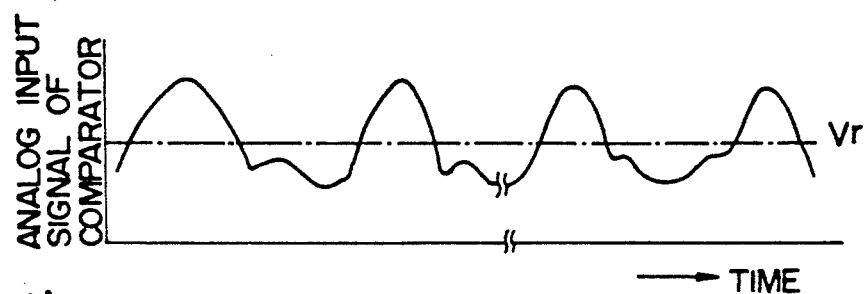
Figure 8:
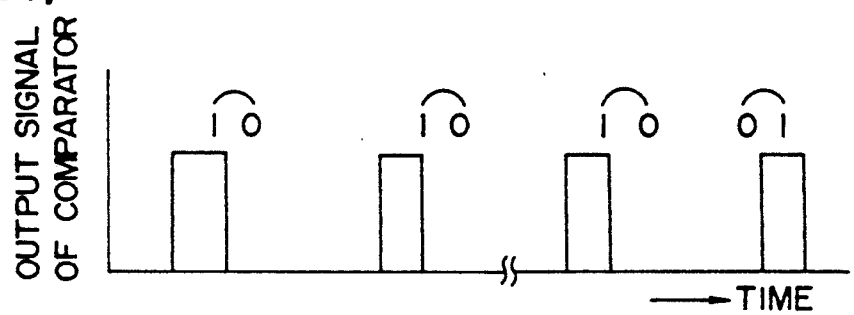
Figure 8:
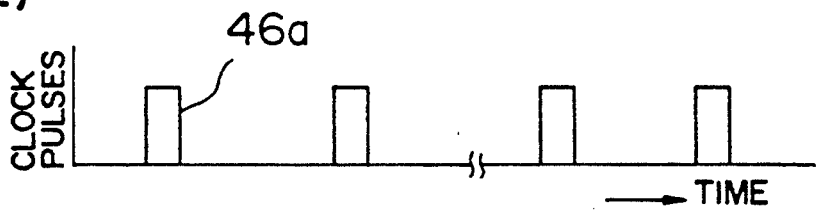
Figure 8C:
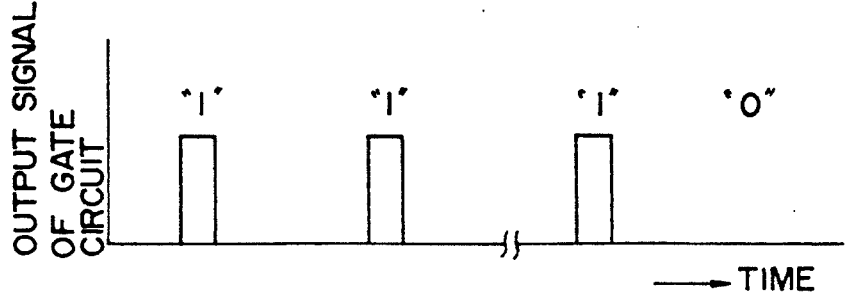

FIGS. 8(a1), 8(a2), 8(b2), and 8(c) show corresponding relationships between the alignment of atoms 51 on the Si surface and the input or output waveforms of the parts of the digital signal circuits 3a-2 and 3b-2. FIG. 8(a1) represents the alignment of atoms 51 on the Si surface, FIG. 8(a2) represents an analog signal which is outputted from the controlling circuit 45 and is inputted to the comparator 49, and FIG. 8(b1) represents an output waveform of the comparator 49 obtained when the analog signal shown in FIG. 8(a2) and a threshold voltage (Vr) 53 are inputted to the comparator 49. As shown in FIG. 8(b1) the output signal of the comparator 49 includes a signal pair of (1, 0) or (0, 1) which corresponds to the leftward or rightward ascending dimer shown in of FIG. 8(a1). As shown FIG. 8(b2) a clock pulse 46a for operating the electrode scanning system 42 shown in FIG. 7 is synchronous with a timing when the tip electrode 2 is positioned just above the left atom of each dimer shown in of FIG. 8(a1). When the output signal of the comparator 49 in FIG. 8(b1) and the clock pulse 46a in FIG. 8(b2) are inputted to the gate circuit 50, the gate circuit 50 outputs a signal of "1" corresponding to the leftward ascending dimer or a signal of "0" corresponding to the leftward descending or rightward ascending dimer, as shown in FIG. 8(c).

Figure 9:
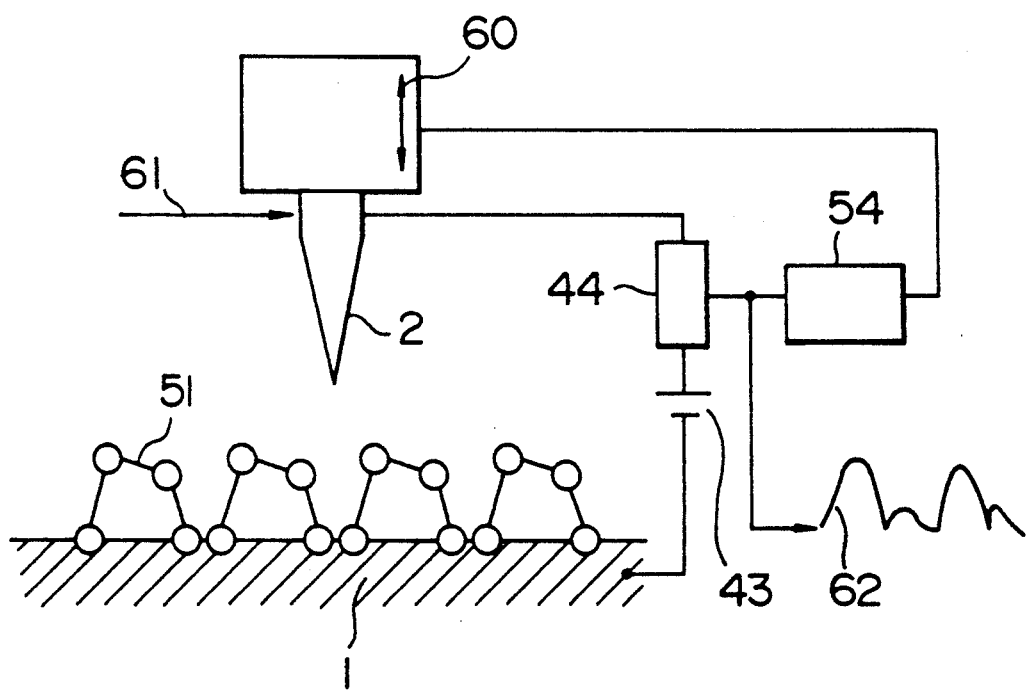
FIG. 9 is a block diagram showing an information storage apparatus which effects the reading of information at a high speed.

FIG. 9 shows an embodiment in which the reading of information at a high speed is realized. In the present embodiment, a constant-current controlling circuit 54 having a response frequency lower than that of the controlling circuit 45 shown in FIG. 7 is provided in lieu of the controlling circuit 45, and a control circuit 60 for crash prevention is provided in order that the movement of a tip electrode 2 does not follow a minute unevenness in height of atoms 51 of the surface of an Si substrate 1 and follows only a large change of the Si surface. With such construction, even if the tip electrode 2 is scanned at a speed which is faster as compared with that in the embodiment shown in FIG. 7, the tip electrode 2 can be scanned without colliding with the Si substrate 1. At this time, since the tunnel gap changes, a change in tunnelling current corresponding to the magnitude of the tunnel gap is obtained as an output of a current detection circuit 44. As a result, a waveform as shown by reference numeral 62 in FIG. 7 is obtained as the waveform of an output signal from the controlling circuit 54. If this output signal is inputted through a capacitive coupling to the comparator 49 shown in FIG. 7, memory information similar to that obtained in the embodiment of FIG. 7 is obtained.

Figure 10:
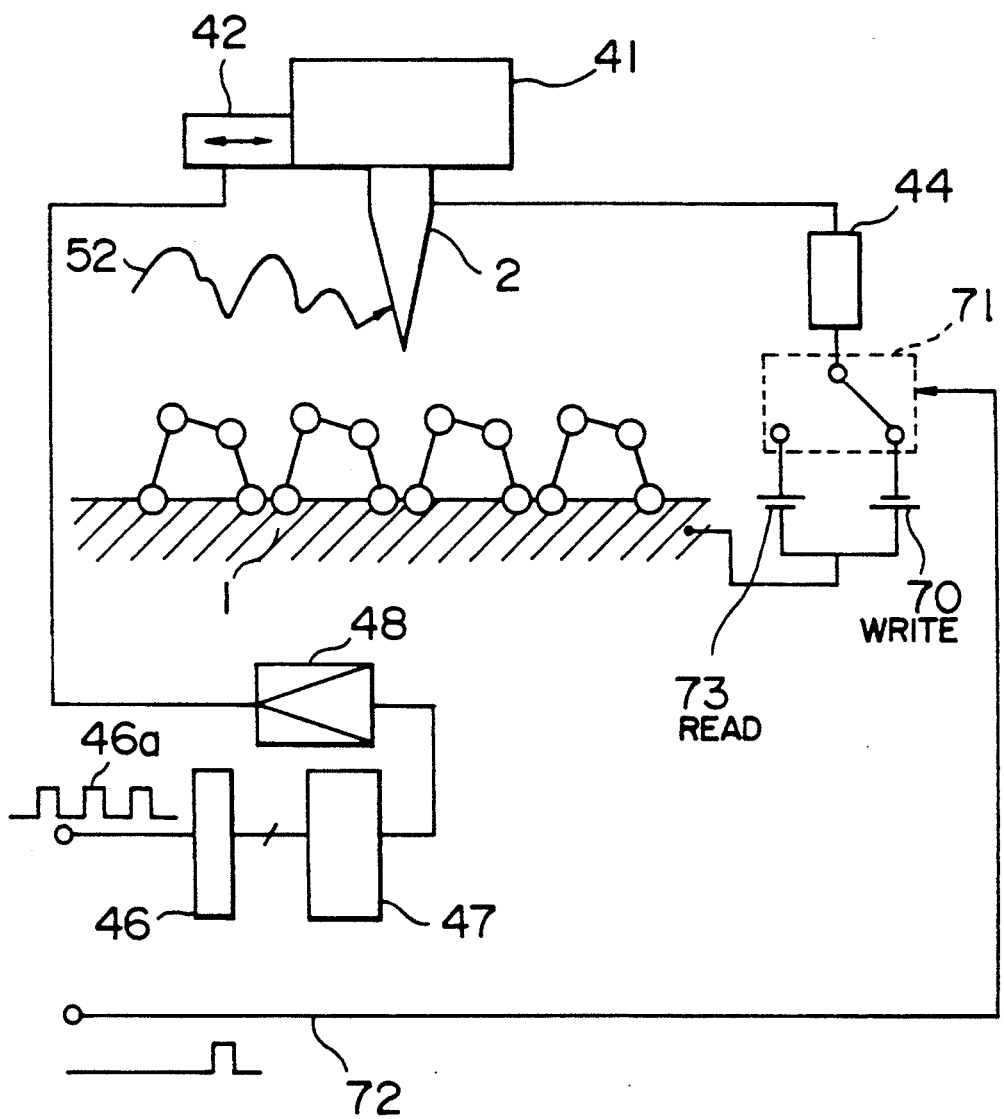
FIG. 10 is a diagram for explaining an information write operation.

FIG. 10 shows an example of an information write operation in the present invention. The writing of information is performed utilizing a phenomenon that if electrons having an energy of at least several electron volts are injected into one of paired atoms of a dimer on the Si surface having a higher bonding energy, as shown in FIG. 6, the bonding energy of the other atom having possessed a lower bonding energy becomes high. The difference of the construction of FIG. 10 from that of FIG. 7 or 9 for the read of information lies in that there are provided a D.C. bias 70 for writing and a D.C. bias 73 for reading and a switch 71 for selecting whether or not the writing of information should be performed. In order to change an atomic alignment on the Si surface at a desired position from a leftward ascending state to a rightward ascending state or to rewrite stored information from "1" to "0", a write signal 72 is inputted to the switch 71 when a desired address is set by clock pulses 46a. Thereupon, the D.C. bias 70 for writing is selected so that such a change in atomic alignment as shown in FIG. 6 is produced, thereby rewriting the information. Namely, in the case where the write signal 72 is turned on when an electrode 2 is positioned in the vicinity of one of paired atoms of a leftward ascending dimer which has a higher bonding energy, the information is rewritten from "1" to "0". On the other hand, in the case where the write signal 72 is turned on when the tip electrode 2 is positioned in the vicinity of one of paired atoms of a rightward ascending dimer which has a higher bonding energy, the information is rewritten from "0" to "1". In a usual condition or in the case where information is not to be written, D.C. bias 73 (corresponding to the D.C. bias 43 shown in FIG. 7 or 9) used for reading of information is selected so that the pattern of the atomic alignment makes no change even if the tip electrode 2 is placed in the vicinity of atoms on the Si surface.

FIG. 11 shows an embodiment of an information storage apparatus which performs the information write and read operations as mentioned above. The information storage apparatus shown in FIG. 11 includes a recording medium 81 of a Si crystal which having a (001) plane as a recording surface and shown in detail in FIG. 11A, a medium holding device 82 which has a function of holding the recording medium, a recording/reproducing head (or electrode) 83, made of tungsten, which performs the recording/reproduction of information, a PZT 3-axis actuator 84 which holds the head 83 or moves the head 83 to any position, a vacuum chamber 85 which shields the recording medium 81 and the head 83 from the open air in order to maintain them into clean states, an exhauster 86 which exhausts the gas from the vacuum chamber 85, an exhauster attaching/detaching valve 87 which connects the exhauster 86 to the vacuum chamber 85, a control section which controls the head 83, and a signal processing section 89 which processes recording and reproduction signals. The control section 88 is composed of an access controller 88a, an X-Y axis servo circuit 88b, an X-Y axis driving circuit 88c, a Z axis servo circuit 88d, a Z axis driving circuit 88e and a current detecting amplifier 88f. The signal processing section 89 is composed of a waveform shaping/pulsing circuit 89a, a clock generating circuit 89b and a discriminating circuit 89c.

Explanation will now be made of the operation of the information storage apparatus according to the present embodiment. A two-dimensional address in X and Y directions is written into the recording medium 81 by the operation mentioned in the foregoing. A request for writing or reading of information is transmitted from an interface 90 to the access controller 88a and the detecting amplifier 88f. Addresses of information stored in the recording medium 81 (inclusive of address information) and the current position of the head 83 are recorded in the access controller 88a. The access controller 88a calculates a movement amount or a target value for moving the head 83 to a position of the recording medium 81 at which the requested write or read operation is to be performed. The access controller 88a transfers the result of the calculation to the servo circuit 88b on the basis of an ON/OFF signal from the detecting amplifier 88f. Based on the result of the calculation from the access controller 88a and address information from the detecting amplifier 88f, the servo circuit 88b produces a control signal for moving the head 83 to a desired position. This control signal is sent to the driving circuit 88c and is amplified thereby to drive the actuator 84. The actuator 84 moves the head 83 in the X-Y direction.

On the other hand, the servo circuit 88e produces, on the basis of a signal from the detecting amplifier 88f, a control signal for maintaining a gap between the head 83 and the recording medium 81 at a predetermined value. This control signal is amplified by the driving circuit 88e to drive the head 83 in a Z-axis direction. A signal corresponding to information to be stored is sent from the interface 90 to the detecting amplifier 88f. In accordance with the operations mentioned in conjunction with FIGS. 7 and 10, the detecting amplifier 88f applies a voltage necessary for a recording/reproducing operation to the head 83 and detects and amplifies recorded information or address as a tunnelling current. An address signal amplified by the detecting amplifier 88f is sent to the servo circuit 88b in order to control the position of the head 83 and is also sent to the access controller 88a in order to record the position of the head 83. An information reproduction signal amplified by the detecting amplifier 88f is sent to the servo circuit 88d in order to control the gap between the head 83 and the recording medium 81 to the predetermined value and is also sent to the waveform shaping/pulsing circuit 89a in order that it is outputted as information.

The waveform shaping/pulsing circuit 89a shapes the reproduced information waveform so that it has a high S/N ratio. The shaping/pulsing circuit 89a further shapes the waveform into a pulse form and sends the pulse-shaped information signal to the generating circuit 89b and the discriminating circuit 89c. The generating circuit 89b generates a clock synchronous with an information reproduction rate by use of the information transmitted from the shaping/pulsing circuit 89a and transmits the clock to the discriminating circuit 89c and the interface 90. At a timing of the clock generated by the generating circuit 89b, the discriminating circuit 89c judges whether an information pulse has a high level or a low level. The result of judgement is transmitted as binary code information to the interface 90.

According to the present embodiment, since it is possible to use control techniques and signal processing methods which have hitherto been used in STM's, magnetic disk devices and so on, the recording/reproduction of information is easily possible at a high speed, and a high-reliability, small-size, high-speed and large-capacity storage apparatus can be realized.

In the storage apparatus, the formation of addresses on the recording medium is necessary in addition to the provision of the above-mentioned read and write functions. Particularly, equivalents to sectors and tracks of the conventional magnetic disk or the like can be formed on the recording medium by artifically forming markers on the recording medium. This can be realized by a lithographic process or a mechanical machining of the Si substrate surface by the tip electrode 2 used for the reading/writing of information. In this case, it is preferable that an address marker is made larger than a bit atom pair. Thereby, it is possible to position the electrode 2 at a desired sector or track position at a high speed. In the foregoing, the tunnelling current has been made the object of detection to provide the read function in the present invention. STM related techniques using as the object of detection another physical quantity such as small force, light, electrostatic capacitance, heat (temperature) or sound (distorted wave) can also be applied to embody the present invention.

The preservability and stability of information can be improved by improving the stability of an atomic alignment or reconstruction formed. The larger an energy for the writing of information becomes, the higher the stability of the atomic alignment becomes. For example, the use of the atomic alignment shown in FIG. 3 or 4 suffices to provide the improved stability. In order to further improve the stability, the writing of information is made using a dimer vacancy (13 in FIG. 12) where a dimer atom pair is missing, a defect structure which is produced by combining a dimer vacancy with the surface defect structure shown in FIG. 3 or 4, or an absorbed or bonded atom (16 in FIG. 13) which is deposited on the surface. It is not necessary that the absorbed atom is the same in kind as atoms which form the surface. The storage unit of information may be an atom(s) or a molecules(s).

Figure 12:
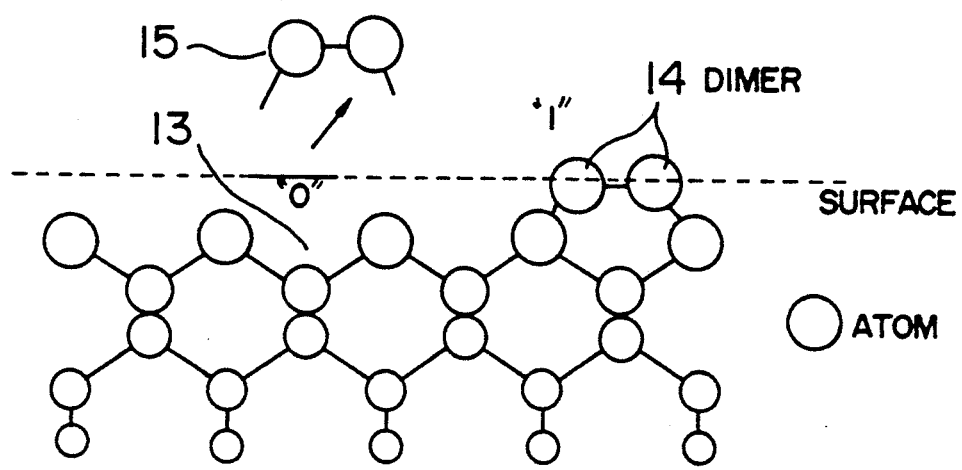
FIG. 12 is a side view showing a corresponding relationship between a dimer vacancy, a surface dimer and bits.
Figure 13:
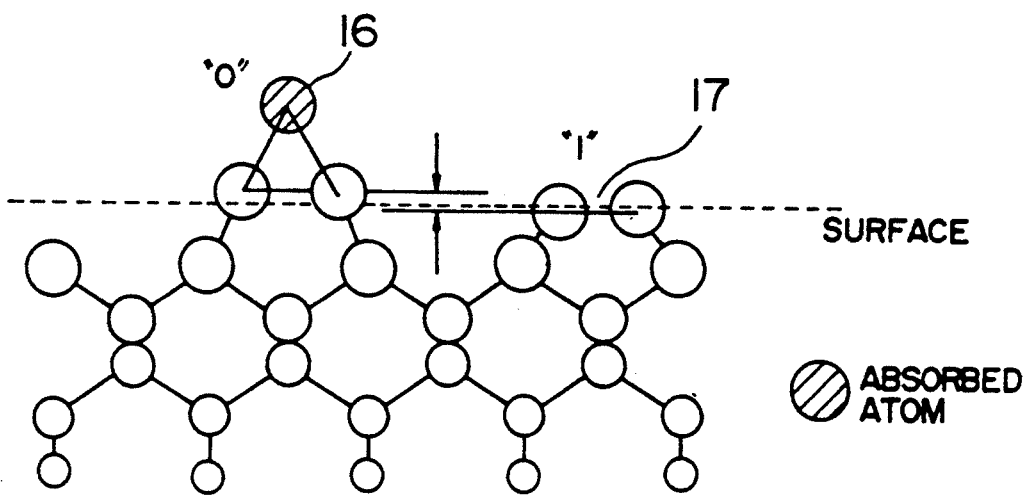
FIG. 13 is a side view showing an absorbed atom, a surface dimer and bits.

FIG. 12 shows an example in which a dimer vacancy and a surface dimer are caused to correspond to bits "0" and "1", respectively. FIG. 13 shows an example in which an absorbed atom (Si or other atom) and a surface dimer are caused to correspond to bits "0" and "1", respectively. In order to perform the writing of information by use of a dimer vacancy (or a vacancy where two atoms forming a dimer are missing), the sample surface is irradiated with optical energy such as with a laser beam to cause a localized increase in temperature or pressure is applied, thereby removing the dimer or one of atoms which form the dimer. In the case of FIGS. 12 and 13, it is necessary to externally supply energy which causes dissociation or a chemical reaction. The atomic alignment structure shown in FIG. 12 or 13 can be used as a ROM (Read Only Memory).

In the case of the atomic alignment structure shown in FIG. 12 or 13, too, it is necessary to make the temperature of a substrate low since atoms move around on the surface when the ambient temperature is high. In the case where the melting point of a substrate is $T_m$, a substrate temperature T is set to a value lower than a temperature at which only an upper portion of the surface pre-melts, i.e., $T<2/3T_m$, or several ° K.

In general, bit information based on the conventional information theory may be stored as spare information even for a dimer which exists near a dimer holding certain specified information. With such a construction, the reliability of a storage device is improved since the original bit information can be restored even if the system is disturbed due to any cause. In order to reserve written information for a long period of time, a method can be employed in which a surface having information stored thereon or its surroundings is stabilized or passivated by oxidation or a chemical reaction with another substance to prevent the surface state from making a change depending upon temperature. There may also be employed a simple method in which the magnitude of a thermal vibration is made small by merely lowering the temperature.

On the other hand, the reliability of information can be improved by forming one group by an assembly of a plurality of atoms and storing one unit of information for each group since noise is cancelled in such a construction. More especially, it is possible to utilize a phenomenon that a plurality of dimers interact with each other so that the directions of the dimers align or become the same. It is also possible to utilize a phenomenon that the directions of dimers or vacancies are aligned at a certain specified temperature. Namely, by use of such a temperature, one unit of information can be stored in the whole of a certain region. For example, the whole of an Si (100) crystalline plane exhibits a change from a (4×2) structure to a (2×1) structure at a certain temperature. Further, at a certain temperature is exhibited a change from a (2×1) symmetry (observed in the case where defects are randomly distributed) to a (2×8) or (2×11) symmetry observed in the case where defects are aligned. Information is stored in a surface state by causing "1" and "0" to correspond to the case where the defects are aligned and the case where the defects are randomly distributed, respectively.

Much information can be stored in a small region by applying a surface passivating material on a surface having information written therein, laminating thereon a material used upon writing of information, performing a recording operation, and further laminating the above-mentioned material thereon. According to this method, it is also possible to form a certain pattern in a partial surface region and to store pattern information such as a bar code in that pattern.

Though the examples of a Si (100) plane have been shown in the foregoing embodiment, a storage device functioning based on the same principle can also be fabricated using another Si surface or a surface of a material other than Si. Even in the case of a Si (111) reconstructed plane including no dimer, a storage device or an information processor using the storage apparatus can be fabricated using an atomic structure peculiar to the surface reconstruction.

In the foregoing embodiments, bit information has been used as the storage unit of information. However, information can be stored in another form. For example, pattern information such as a bar code can be stored in a partial region of a surface by changing the pressure or temperature of the surface so that defects on the surface are distributed randomly or in a specified ordered state.

Figure 14:
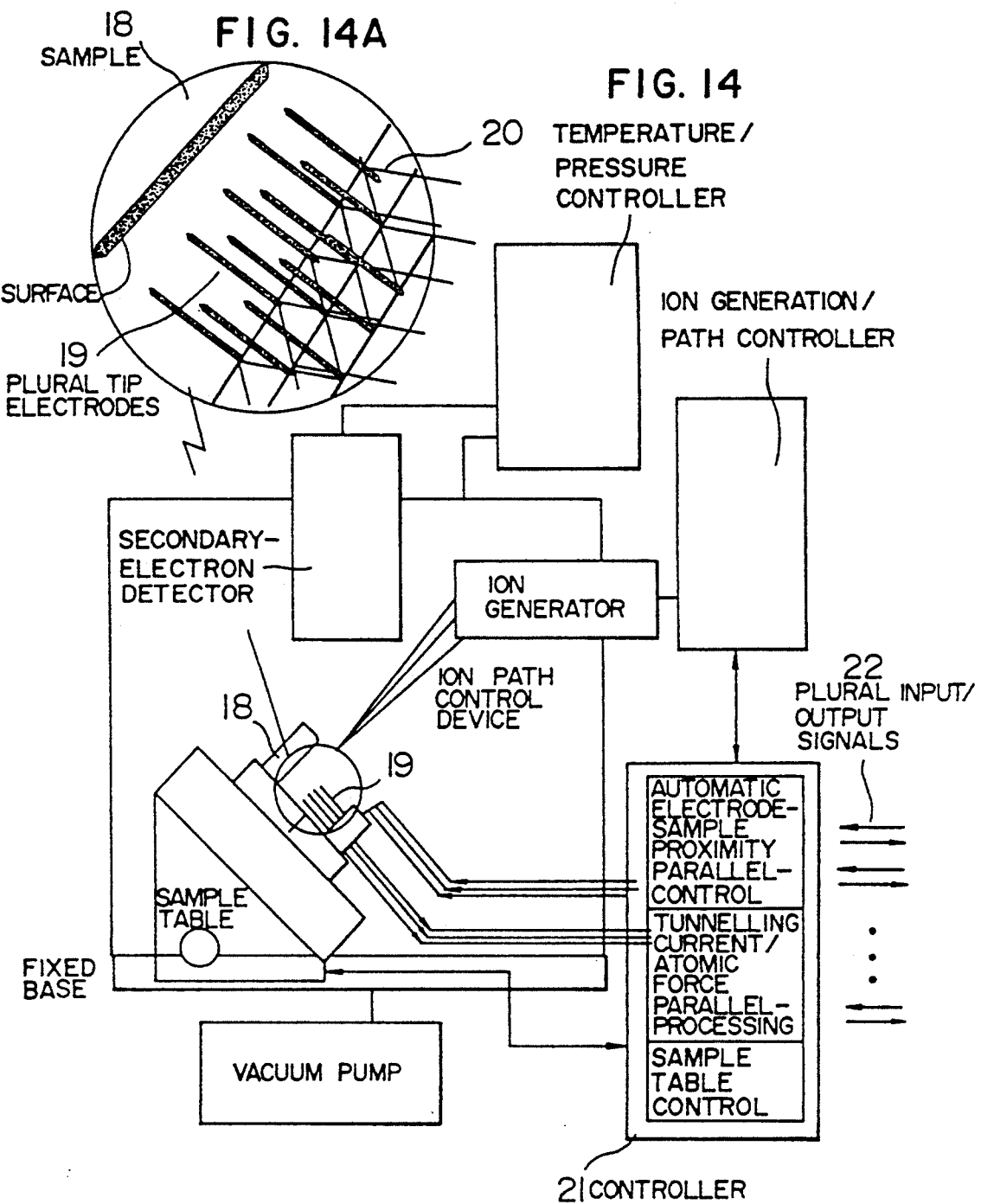
FIG. 14 is a block diagram showing an embodiment of an information storage apparatus which uses a plurality of electrodes.

In the above examples, a single tip electrode is used. Therefore, a long time is required for the writing/reading of information. FIG. 14 shows an embodiment of an information storage apparatus which uses a plurality of tip electrodes to perform concurrently the writing/reading of a plurality of units of information. In the embodiment shown in FIG. 14, a plurality of electrodes 19 shown in detail in FIG. 14A are provided corresponding to a plurality of input/output signals 22 and a control process associated with the reading/writing of information is performed in a parallel manner by use of a parallel computer or a parallel processor.

As shown in FIG. 14, by providing a plurality of tip electrodes to a device which can change concurrently a state of electrons or atoms or alignment of a surface by use of a tunnelling current or an atomic force induced by electrons, for example, an STM (Scanning Tunnelling Microscope), or an MBE (Molecular Beam Epitaxy) device which can deposit an atom, it is possible to move atoms at once or in parallel to place them at desired positions or to remove them, thereby effecting the writing of information.

Figure 15:
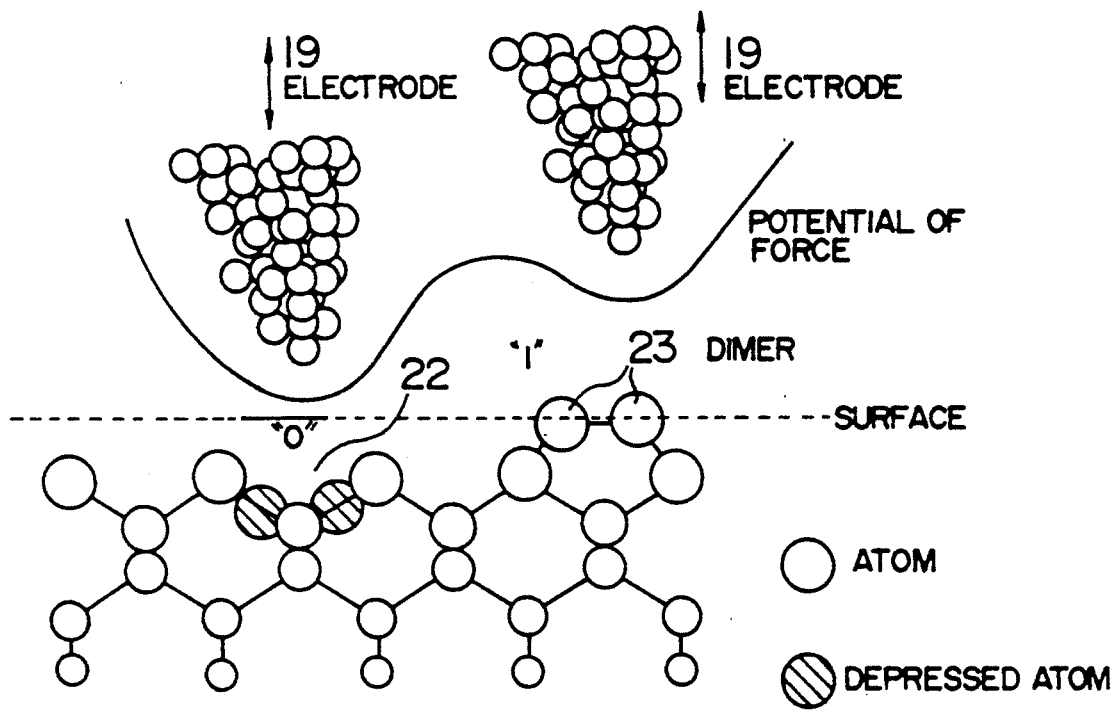
FIG. 15 is a side view for explaining a relationship between the surface of a recording medium and tip electrodes at an atomic level or scale in the information storage apparatus which uses the plurality of electrodes.

Explanation will now be made of the details of the construction of an information storage apparatus, as shown in FIG. 14, in which a plurality of tip electrodes are used. A plurality of tip electrodes are mounted with their bases being positioned at the intersecting points of a network composed of a plurality of signal lines 20, as shown in FIG. 14A, and the plurality of tip electrodes are arranged so as to correspond to atoms or atom groups (for example, 22 and 23 in FIG. 15) to be controlled by the tip electrodes (1a in FIG. 15), as shown in FIG. 15. Data can be stored effectively by making each intersecting point of the network correspond to the address of data in an information processor to utilize the hitherto-known techniques of semiconductor storage devices. The control of the tip electrodes in this case is such that a tip electrode corresponding to the data address is vertically moved to change a tunnelling current or a quantum mechanical force or a pulse is generated from a tip electrode corresponding to the data address to apply an electromagnetic force for a short time. As a result, it is possible to change the structure of atoms or groups of atoms respectively positioned below the tip electrodes. In some materials, an atom or a group of atoms positioned below a tip electrode can be operated on independently. In the case where an atomic alignment structure as shown in FIG. 3 or 4 is formed for a GaAs or Si semiconductor, the above operation becomes possible since an activation energy for forming the structure itself is several electron volts. Especially, the case of such an atomic alignment as shown in FIG. 3 or 4 can be constructed such that a read operation produces no influence on the alignment structure. Therefore, a storage device can be used as an SRAM. In the case where the read operation produces an influence, the storage device can be used as a DRAM.

As mentioned above, an information storage apparatus of the present invention includes a recording medium in which information is stored in a region on the order of an inter-atomic distance, recording means which records information in the recording medium in accordance with an external signal, and detecting means which detects information from the recording means.

According to the present invention, information is recorded by use of an atomic alignment which is stable at an atomic level. Therefore, it is possible to realize an extremely high density storage apparatus which can store information in an area on the order of one several-millionth to one several-hundred millionth of that in the conventional storage devices. Also, a time required for transition between stable atomic alignments is very short. Therefore, high-speed recording can be realized in accordance with the principle of the present invention.

We claim:
1. An information storage apparatus comprising:
   a recording medium having a plurality of dimers formed at a surface thereof, each dimer of said dimers being composed of two atoms which take either a first alignment or a second alignment;
   a tip electrode disposed with respect to the atoms forming a selected one of said dimers with a gap which is on the order of an inter-atomic distance;
   force detecting means for detecting a first electromagnetic force corresponding to an energy which is produced in said gap between said tip electrode and each of the atoms forming said selected one of said dimers;
   signal detecting means for judging whether one unit of information corresponding to said selected one of said dimers is a true value or a false value on the basis of an output waveform obtained by said force detecting means; and
   signal recording means for applying a second electromagnetic force for causing a change to either said first alignment or said second alignment of the atoms forming said selected one of said dimers to one of the atoms forming said selected one of said dimers or one atom from said tip electrode through said gap in accordance with whether said one unit of information corresponding to said selected one of said dimers to be recorded as said true value or said false value.

2. An information storage apparatus according to claim 1, further comprising:

gap controlling means for controlling a magnitude of said gap between said tip electrode and the atoms forming said selected one of said dimers in accordance with a control signal for writing or reading of information; and tip electrode scanning means for controlling a position of said tip electrode above said surface of said recording medium in accordance with a designated address corresponding to said selected one of said dimers.

3. An information storage apparatus according to claim 2, wherein said signal detecting means produces said control signal in accordance with the output waveform obtained by said force detecting means, said control signal being applied to said gap controlling means to make constant the magnitude of the gap between said tip electrode and the atoms forming said selected one of said dimers, and said signal detecting means judges whether said one unit of information corresponding to said selected one of said dimers is said true value or said flase value on the basis of a waveform of said control signal.

4. An information storage apparatus according to claim 1, wherein said recording medium comprises a surface structure of monocrystalline silicon with a (100) plane.

5. An information storage apparatus according to claim 1, wherein said recording medium comprises a surface structure of monocrystalline silicone with a (111) plane.

6. An information storage apparatus according to claim 1, wherein said signal recording means determines whether or not to apply the second electromagnetic force for causing the change to either said first alignment or said second alignment on the basis of the output waveform obtained by said force detecting means.

7. An information storage apparatus according to claim 1, wherein at least two of said dimers including said selected one of said dimers constitute said one unit of information.

8. An information storage apparatus according to claim 1, said first alignment is an alignment in which the two atoms forming said each dimer are both present and said second alignment is an alignment in which at least one of the two atoms forming said each dimer is missing.

9. An information storage apparatus according to claim 1, wherein said force detecting means detects as said first electromagnetic force a tunnelling current which flows through the gap between said tip electrode and the atoms forming said selected one of said dimers.

10. An information storage apparatus according to claim 1, wherein said first alignment is an alignment in which a group of atoms forming at least two of said dimers including said selected one of said dimers is depressed into the surface of said recording medium and said second alignment is an alignment in which said group of atoms protrudes from the surface of said recording medium, and wherein said signal recording means applies as said second electromagnetic force a voltage for causing said change to either said first alignment or said second alignment to said group of atoms from said tip electrode through said gap in accordance with whether said one unit of information is to be recorded as said true value or said false value.

11. An information storage apparatus according to claim 1, wherein said first alignment is an alignment in which a group of atoms forming at least two of said dimers including said selected one of said dimers is removed from the surface of sad recording medium and said second alignment is an alignment in which said group of atoms remains on the surface of said recording medium, and wherein said signal recording means applies as said second electromagnetic force a voltage for causing said change to either said first alignment or said second alignment to said group of atoms from said tip electrode through said gap in accordance with whether said one unit of information is to be recorded as said true value or said false value.

12. An information storage apparatus according to claim 1, wherein said first alignment is an alignment in which at least one atom is added to said selected one of said dimers and said second alignment is an alignment in which said at least one atom is removed from said selected one of said dimers, wherein each atom of said at least one atom is one of (1) a same type of atom as the atoms forming said selected one of said dimers and (2) a different type of atom than the atoms forming said selected one of said dimers, and wherein said signal recording means applies as said second electromagnetic force a voltage for causing said change to either said first alignment or said second alignment to said at least one atom from said tip electrode through said gap in accordance with whether said one unit of information is to be recorded as said true value or said false value.

13. An information storage apparatus comprising:
a recording medium having a plurality of dimers formed at a surface thereof, each dimer of said dimers being composed of two atoms which take either a first alignment or a second alignment;
a tip electrode disposed with respect to the atoms forming a selected one of said dimers with a gap which is on the order of an inter-atomic distance;
force detecting means for detecting a first electromagnetic force corresponding to an energy which is produced in said gap between said tip electrode and each of the atoms forming said selected one of said dimers;
signal detecting means for judging whether one unit of information corresponding to said selected one of said dimers is a true value or a false value on the basis of an output waveform obtained by said force detecting means; and
signal recording means for applying a second electromagnetic force for causing a change to either said first alignment or said second alignment of the atoms forming said selected one of said dimers to one of the atoms forming said selected one of said dimers or one atom from said tip electrode through said gap in accordance with whether said one unit of information corresponding to said selected one of said dimers is to be recorded as said true value or said false value;
wherein said first alignment is an alignment in which a bond between the two atoms forming said each dimer has a leftward ascending direction and said second alignment is an alignment in which the bond has a rightward ascending direction.

14. An information storage apparatus comprising;
a recording medium having a plurality of dimers formed at a surface thereof, each dimer of said dimers being composed of two atoms which take either a first alignment or a second alignment;
a tip electrode disposed with respect to the atoms forming a selected one of said dimers with a gap which is on the order of an inter-atomic distance;

force detecting means for detecting a first electromagnetic force corresponding to an energy which is produced in said gap between said tip electrode and each of the atoms forming said selected one of said dimers;

signal detecting means for judging whether one unit of information corresponding to said selected one of said dimers is a true value or a false value on the basis of an output waveform obtained by said force detecting means; and signal recording means for applying a second electromagnetic force for causing a change to either said first alignment or said second alignment of the atoms forming said selected one of said dimers to one of the atoms forming said selected one of said dimers or one atom from said tip electrode through said gap in accordance with whether said one unit of information corresponding to said selected one of said dimers is to be recorded as said true value or said false value;

wherein said first alignment is an alignment in which said each dimer protrudes from the surface of said recording medium and said second alignment is an alignment in which at least one of the two atoms forming said each dimer is depressed into the surface of said recording medium.

15. An information storage apparatus comprising:

a recording medium having a plurality of dimers formed at a surface thereof, each dimer of said dimers being composed of two atoms which take either a first alignment or a second alignment;

at least two tip electrodes disposed with respect to the atoms forming at least two selected ones of said dimers with a same gap which is on the order of an inter-atomic distance;

gap controlling means for controlling a magnitude of said gap between said at least two tip electrodes and the atoms forming said at least two selected ones of said dimers in accordance with a control signal for writing or reading of information;

tip electrode scanning means for controlling a position of said at least two tip electrodes above said surface of said recording medium in accordance with a designated address corresponding to said at least two selected ones of said dimers;

at least two force detecting means respectively corresponding to said at least two tip electrodes for detecting a first electromagnetic force corresponding to an energy which is produced in said gap between said at least two tip electrodes and the atoms forming said at least two selected ones of said dimers;

at least two signal detecting means respectively corresponding to said at least two tip electrodes for judging whether each of at least two units of information respectively corresponding to said at least two selected ones of said dimers is a true value or a false value on the basis of respective output waveforms obtained by said at least two force detecting means; and at least two signal recording means respectively corresponding to said at least two tip electrodes for applying a second electromagnetic force for causing a change to either said first alignment or said second alignment of the atoms forming said at least two selected ones of said dimers or one atom from each of said at least two tip electrodes through said gap in accordance with whether said at least two units of information corresponding to said at least two selected ones of said dimers are to be recorded as said true value or said false value;

whereby a group of information consisting of said at least two units of information is read from or written into said recording medium in parallel.

16. A method of writing information into a material constituting a recording medium or reading written information from the material, the material including a plurality of atomic groups on its surface, each atomic group including at least two atoms, the method comprising the steps of:

applying a first amount of energy corresponding to a unit of information to a probe in response to a write instruction;

changing an atomic alignment of one atomic group of the atomic groups from a first alignment to a second alignment with the first amount of energy applied to the probe, the probe being opposed to the one atomic group and not being in contact with any atom of the one atomic group, the probe interacting with the one atomic group by the first amount of energy, the first amount of energy exceeding a critical energy associated with the first alignment;

applying a second amount of energy to the probe in response to a read instruction, the second energy being predetermined and being associated with the second alignment, the second amount of energy being lower than the critical energy;

detecting an interaction between the probe and the one atomic group upon application of the second energy to determine whether the one atomic group has the first alignment or the second alignment; and converting a result of the determination into the information unit.

17. An information storage device comprising a recording medium constituted by a surface structure of a material, the surface structure including a plurality of atomic groups, each of which corresponds to a unit of information and includes at least two atoms, each said atomic group is in having a first atomic alignment in a not-recorded state or a second atomic alignment in a recorded state.

18. An information storage apparatus comprising:

a recording medium including a group of atoms at a surface thereof, an atomic alignment of the atoms being changed by an action on the atoms such that the atoms assume one of a first alignment and a second alignment; and access means, including a tip electrode disposed with a gap from each atom of the group, for selectively acting on the group through the tip electrode based on one unit of information to be stored such that the atomic alignment of the atoms of the group is changed, and for reading a stored one unit of information from an interaction between the tip electrode and said each atom of the group.

19. An information storage apparatus according to claim 18, further comprising:

control means for controlling scanning of the tip electrode above the surface of the recording medium in accordance with a designated address vehicle maintaining the gap.

20. An information storage apparatus according to claim 18, wherein the recording medium comprises a surface structure of monocrystalline silicon with a (100) plane.

21. An information storage apparatus according to claim 18, wherein the recording medium comprises a surface structure of monocrystalline silicon with a (111) plane.

22. An information storage apparatus according to claim 18, wherein the access means further includes recording means for causing the tip electrode to apply an electromagnetic force on the group such that the atoms of the group assume either the first alignment or the second alignment.

23. An information storage apparatus according to claim 18, wherein the group of atoms is a dimer of two atoms in which the one unit of information is stored.

24. An information storage apparatus according to claim 23, wherein the first alignment is an alignment of the dimer in which a bond between the two atoms of the dimer is ascendant in a first direction and the second alignment is an alignment of the dimer in which the bond is ascendant in a second direction different from the first direction.

25. An information storage apparatus according to claim 23, wherein the dimer protrudes from the surface in the first alignment and at least one of the two atoms of the dimer is depressed into the surface in the second alignment.

26. An information storage apparatus according to claim 18, wherein all of the atoms of the group are present in the first alignment and at least one atom of the group is absent in the second alignment.

27. An information storage apparatus according to claim 18, wherein the access means further includes means for acting on the group of atoms with a tunnelling current which flows through the gap between the tip electrode and each said atom of the group.

28. An information storage apparatus according to claim 18, wherein the access means further includes means for acting on the group of atoms through the tip electrode such that the atoms of the group are depressed into the surface of the recording medium in the first alignment and the atoms of the group protrude from the surface of the recording medium in the second alignment.

29. An information storage apparatus comprising:
a recording medium including a dimer at a surface thereof, the dimer being composed of two atoms; and
access means for cutting a bond between the two atoms of the dimer to attach a group of atoms to the atoms of the dimer to achieve a first atomic alignment and for removing the group of atoms from the atoms of the dimer to achieve a second atomic alignment, whereby one unit of information is stored using the first atomic alignment or the second atomic alignment.

30. An information storage apparatus comprising:
a recording medium having a plurality of dimers formed at a surface thereof, each of the dimers being composed of two atoms;
a plurality of tip electrodes;
gap controlling means for controlling each tip electrode to maintain a gap between the tip electrode and each atom of corresponding ones of the dimers in accordance with a control signal for writing information or reading information;
electrode scanning means for controlling a position of the plurality of tip electrodes above the surface of the recording medium in accordance with a designated address;
a plurality of signal recording means respectively provided for the plurality of tip electrodes for changing a position of at least on atom of one of the dimers corresponding to each of the tip electrodes to achieve a first atomic alignment or a second atomic alignment through the tip electrode in accordance with one unit of information to be recorded; and
a plurality of reading means respectively provided for the plurality of electrodes for detecting through the tip electrode whether the dimer has the first atomic alignment or the second atomic alignment, and for reproducing a recorded one unit of information based on a signal indicating whether the dimer has the first atomic alignment or the second atomic alignment.

31. A method of writing information into a material constituting a recording medium or reading written information from the material, the material including a plurality of dimers on its surface, each dimer including two atoms, the method comprising the steps of:
applying a first amount of energy corresponding to a unit of information to a probe in response to a write instruction;
changing positions of atoms of one of the dimers from a first atomic alignment to a second atomic alignment with the first amount of energy applied to the probe, the probe being opposed to the one dimer and not being in contact with any atom of the one dimer, the probe interacting with the one dimer by the first amount of energy, the first amount of energy exceeding a critical energy associated with the first atomic alignment;
applying a second amount of energy to the probe in response to a read instruction, the second amount of energy being predetermined and being associated with the second atomic alignment, the second amount of energy being lower than the critical energy;
detecting an interaction between the probe and the one dimer upon application of the second amount of energy to determine whether the one dimer has the first atomic alignment or the second atomic alignment; and
converting a result of the determination into the information unit.

32. An information storage device comprising a recording medium constituted by a surface structure of a material, the surface structure including a plurality of atomic groups, each of which corresponds to a unit of information and includes at least two atoms, each said atomic group having a first atomic alignment in a not-recorded state or a second atomic alignment in a recorded state, a position of the at least two atoms within said each atomic group in the first atomic alignment being different from a position of the at least two atoms within said each atomic group in the second atomic alignment.

33. An information storage apparatus comprising:
a recording medium including a dimer formed of a first atom and a second atom at a surface thereof, the first atom protruding form the second atom in a first alignment of the dimer and the second atom protruding from the first atom in a second alignment of the dimer;
signal recording means having a tip electrode disposed with a gap from the atoms of the dimer for selectively applying a first electromagnetic force to the atoms of the dimer from the tip electrode through the gap based on one unit of information to be stored and corresponding to the dimer to cause the dimer to assume one of the first alignment and the second alignment;

force detecting means for detecting a second electromagnetic force corresponding to an energy which is produced in the gap between the tip electrode and the atoms of the dimer and producing an output waveform indicative of the detection; and signal detecting means for detecting whether the dimer has the first alignment or the second alignment based on the output waveform produced by the force detecting means.

34. An information storage apparatus according to claim 33, further comprising:

gap controlling means for controlling a magnitude of the gap in accordance with a control signal for writing information or reading information; and tip electrode scanning means for controlling a position of the tip electrode above the surface of the recording medium in accordance with a designated address.

35. An information storage apparatus according to claim 34, wherein the signal detecting means includes means for producing the control signal in accordance with the output waveform produced by the force detecting means, the control signal being applied to the gap controlling means to maintain constant the magnitude of the gap between the tip electrode and the atoms of the dimer, and the signal detecting means detects whether the one unit of information corresponding to the dimer is a true value or a false value based on a waveform of the control signal.

36. An information storage apparatus according to claim 33, wherein the recording medium comprises a surface structure of monocrystalline silicon with a (100) plane.

37. An information storage apparatus according to claim 33, wherein the recording medium comprises a surface structure of monocrystalline silicon with a (111) plane.

38. An information storage apparatus according to claim 33, wherein the signal recording means determines whether or not to apply the first electromagnetic force for causing the dimer to assume the one of the first alignment and the second alignment based on the output waveform produced by the force detecting means.

39. An information storage apparatus according to claim 33, wherein the recording medium includes a plurality of dimers, the plurality of dimers including the dimer forming the one unit of information.

40. An information storage apparatus according to claim 33, wherein the first atom of the dimer protrudes from the surface of the recording medium in the first alignment and the second atom of the dimer protrudes from the surface of the recording medium in the second alignment.

* * * * *